US011538969B2

(12) United States Patent
Foerster et al.

(10) Patent No.: US 11,538,969 B2
(45) Date of Patent: Dec. 27, 2022

(54) OPTOELECTRONIC SEMICONDUCTOR COMPONENT

(71) Applicant: Osram OLED GmbH, Regensburg (DE)

(72) Inventors: Michael Foerster, Regensburg (DE); Konrad Wagner, Regensburg (DE); Benjamin Schulz, Regensburg (DE); Stefan Morgott, Pentling (DE); I-Hsin Lin-Lefebvre, Regensburg (DE)

(73) Assignee: Osram OLED GmbH, Regensburg (DE)

( * ) Notice: Subject to any disclaimer, the term of this patent is extended or adjusted under 35 U.S.C. 154(b) by 180 days.

(21) Appl. No.: 16/954,472

(22) PCT Filed: Dec. 18, 2018

(86) PCT No.: PCT/EP2018/085633
§ 371 (c)(1),
(2) Date: Jun. 16, 2020

(87) PCT Pub. No.: WO2019/141472
PCT Pub. Date: Jul. 25, 2019

(65) Prior Publication Data
US 2021/0098666 A1    Apr. 1, 2021

(30) Foreign Application Priority Data
Jan. 19, 2018    (DE) .......................... 102018101170.9

(51) Int. Cl.
*H01L 33/60*    (2010.01)
*H01L 25/075*    (2006.01)
*H01L 33/50*    (2010.01)

(52) U.S. Cl.
CPC .......... *H01L 33/60* (2013.01); *H01L 25/0753* (2013.01); *H01L 33/502* (2013.01)

(58) Field of Classification Search
CPC .... H01L 33/60; H01L 25/0753; H01L 33/502
See application file for complete search history.

(56) References Cited

U.S. PATENT DOCUMENTS

2006/0038198 A1*    2/2006    Chua ...................... H01L 33/50
257/100
2011/0309398 A1    12/2011    Ito et al.
(Continued)

FOREIGN PATENT DOCUMENTS

| EP | 3174110 A1 | 5/2017 |
|---|---|---|
| EP | 3211678 A1 | 8/2017 |
| WO | 2016094422 A1 | 6/2016 |

OTHER PUBLICATIONS

International Search Report and Written Opinion issued in International Patent Application No. PCT/EP2018/085633 dated Mar. 8, 2019.

*Primary Examiner* — Jay C Chang
*Assistant Examiner* — Mikka Liu
(74) *Attorney, Agent, or Firm* — ArentFox Schiff LLP

(57) ABSTRACT

In one embodiment, the optoelectronic semiconductor component comprises at least one semiconductor chip for generating a primary radiation, and also an optical body disposed optically downstream of the semiconductor chip. A reflector surrounds the optical body laterally all around in a positively locking manner and is configured for reflecting the primary radiation and visible light. The optical body has a base surface facing the semiconductor chip and an exit surface facing away from the semiconductor chip. The optical body tapers in a direction away from the semiconductor chip. A quotient of the base surface and a height of the optical body is between 1 mm and 30 mm inclusive.

18 Claims, 5 Drawing Sheets

(56) References Cited

U.S. PATENT DOCUMENTS

Figure 1:
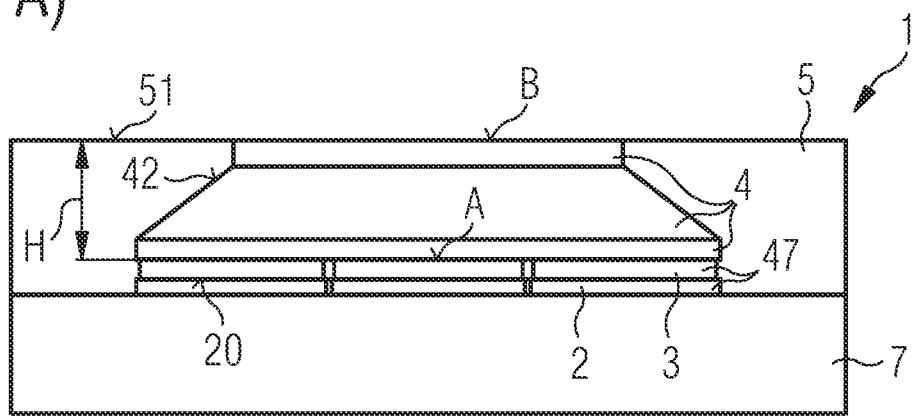
Figure 1:
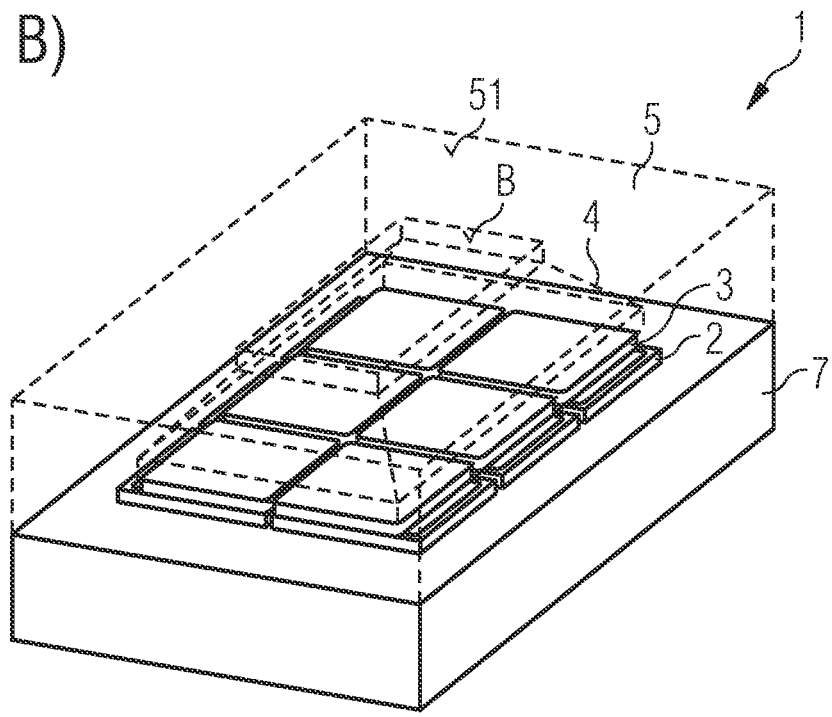

| | | | |
|---|---|---|---|
| 2014/0203306 A1* | 7/2014 | Ito | H01L 33/60 257/98 |
| 2015/0207045 A1* | 7/2015 | Wada | H01L 33/505 438/27 |
| 2016/0079486 A1 | 3/2016 | Sugimoto et al. | |
| 2018/0175265 A1* | 6/2018 | Kim | H01L 33/483 |

\* cited by examiner

A)

B)

A)

B)

OPTOELECTRONIC SEMICONDUCTOR COMPONENT

This application is a 35 U.S.C. § 371 National Phase of PCT Application No. PCT/EP2018/085633, filed Dec. 18, 2018, which claims priority to German Application No. 10 2018 101 170.9, filed Jan. 19, 2018, the disclosures of each of which are hereby incorporated by reference herein.

An optoelectronic semiconductor component is disclosed.

An object of the invention is to specify an optoelectronic semiconductor component which has high luminance.

This object is achieved, inter alia, by an optoelectronic semiconductor component having the features of claim 1. Preferred refinements are the subject matter of the remaining claims.

In accordance with at least one embodiment the optoelectronic semiconductor component comprises one or more semiconductor chips. The at least one sensor chip is configured for generating a primary radiation. The primary radiation is preferably visible light, in particular blue light. Alternatively, the primary radiation can also be ultraviolet radiation, for example, with a wavelength of maximum intensity of at least 360 nm or 385 nm and/or not more than 420 nm or 405 nm. The semiconductor chip is preferably a light-emitting diode chip, or LED chip for short.

In addition, it is possible that the at least one semiconductor chip is configured for generating infrared radiation, in particular near-infrared radiation, for example with an intensity maximum at at least 680 nm and/or no greater than 1060 nm.

To generate the primary radiation, the semiconductor chip comprises a semiconductor layer sequence. The semiconductor layer sequence has an active zone, which can preferably have a pn-junction and/or a quantum well structure.

The semiconductor layer sequence is preferably based on a III-V compound semiconductor material. The semiconductor material can be, for example, a nitride compound semiconductor material, such as $Al_nIn_{1-n-m}Ga_mN$ or a phosphide compound semiconductor material such as $Al_nIn_{1-n-m}Ga_mP$, or else an arsenide compound semiconductor material, such as $Al_nIn_{1-n-m}Ga_mAs$ or $Al_nGa_mIn_{1-n-m}As_kP_{1-k}$, where in each case $0 \leq n \leq 1$, $0 \leq m \leq 1$ and $n+m \leq 1$, and $0 \leq k < 1$. For at least one layer or for all layers of the semiconductor layer sequence the following preferably applies: $0 < n \leq 0.8$, $0.4 \leq m < 1$ and $n+m \leq 0.95$, as well as $0 < k \leq 0.5$. The semiconductor layer sequence can also comprise dopants and additional components. For the sake of simplicity, however, only the essential complements of the crystal lattice of the semiconductor layer sequence, thus Al, As, Ga, In, N or P, are given, even if these may be partially supplemented and/or replaced by trace amounts of other substances.

In accordance with at least one embodiment the semiconductor component contains one or more optical bodies. The at least one optical body is positioned optically downstream of the at least one semiconductor chip, for example optically directly downstream.

According to at least one embodiment the optical body is not an imaging element. This means that the optical body has no focal point and no focal plane. In particular, the optical body is not designed as a convergent lens.

According to at least one embodiment, the optical body is formed integrally and monolithically. In particular, the optical body is free of internal cavities. For example, the optical body is made from a single piece and/or a single material. For example, the optical body is made of a plastic such as PMMA or PC, or also a silicone. Furthermore, the optical body can be made of a glass. In particular, the optical body is made of a material, such as glass, with a low optical refractive index of not more than 1.8 or 1.6 or 1.5, measured at the wavelength of maximum intensity of the primary radiation and a temperature of 300 K.

It is also possible that the optical body is a region with a reduced refractive index compared to the surroundings. This means that the optical device can be a gas such as air, or a liquid, and is preferably surrounded by a formative solid. An evacuated region can also be used for the optical body. The action of the optical body is then due to the refractive index difference relative to the immediate environment, which preferably has a defined geometric shape. In other words, the optical body may be formed by a cavity or hollow space.

In accordance with at least one embodiment the semiconductor component comprises one or more reflectors. The at least one reflector is attached to a side of the optical body. Preferably, the reflector encloses the optical body on all sides in a positive-locking manner. It is possible that side faces of the optical body are partially or completely covered by the reflector. The reflector can be located directly on the side faces.

Positive-locking does not preclude the possibility of a gap located at some points between the optical body and the reflector, wherein the gap can be formed from an evacuated or gas-filled cavity or another solid or liquid material. Particularly preferably, however, the reflector is placed in direct contact with the side faces of the optical body at some points.

According to at least one embodiment, the reflector is configured for reflecting the primary radiation and visible light. This means, for example, that the reflector has a mean reflectivity or a constant reflectivity of at least 80% or 90% or 95% in the spectral range from 380 nm to 700 nm.

According to at least one embodiment, the optical body has a base surface facing the at least one semiconductor chip. The base surface can be designed to be planar. In particular, the base surface is oriented parallel to a main side of the at least one semiconductor chip. On the main side of the associated semiconductor chip, most of the radiation is emitted from this semiconductor chip. The main surface can be a largest, light-emitting surface of the relevant semiconductor chip.

According to at least one embodiment, the optical body has an exit surface facing away from the at least one semiconductor chip. The exit surface is on the opposite side to the base surface. It is possible for the base surface and the exit surface to have a planar shape on average, i.e. they do not have a curvature that extends across the entire base surface or the exit surface, as is the case in convergent lenses or Fresnel lenses. In particular, the base surface and the exit surface can be oriented parallel, or on average parallel, to each other.

According to at least one embodiment, the optical body tapers in a direction away from the at least one semiconductor chip, preferably monotonically or strictly monotonically. Strictly monotonically means that the optical body is continuously and constantly tapered in the direction away from the semiconductor chip. Monotonically means that the optical body can also taper away from the semiconductor chip incrementally, so that sections of the optical body can have a constant width. However, the optical body preferably does not become narrower at any point away from the semiconductor chip, apart from roughened or damaged areas or manufacturing tolerances. The tapered form of the optical body relates to at least one or more cross-sections, preferably all cross-sections throughout the optical body, especially in the direction perpendicular to the radiating surface and/or the base surface.

According to at least one embodiment, a quotient of the base surface area and a height of the optical body is at least 1 mm or 2 mm or 3 mm or 4 mm. Alternatively or in addition, this ratio is not more than 30 mm or 20 mm or 15 mm or 12 mm or 10 mm or 8 mm. The base surface area is the total area of the surface facing the at least one semiconductor chip, measured in mm², for example. The height is the extension of the optical body, in particular from the base surface to the exit surface, determined in particular in the direction perpendicular to the base surface and measured in mm, for example. The quotient of the base surface area and the height therefore results in a unit of length, such as mm.

In at least one embodiment, the optoelectronic semiconductor component comprises at least one semiconductor chip for generating a primary radiation, and an optical body which is optically downstream of the semiconductor chip. A reflector laterally encloses the optical body on all sides in a positive-locking manner and is configured for reflecting at least the primary radiation and visible light. The optical body has a base surface facing the semiconductor chip and an exit surface facing away from the semiconductor chip. In a direction away from the semiconductor chip, the optical body is tapered, preferably monotonically or strictly monotonically. A quotient of the base surface area and a height of the optical body is between 1 mm and 30 mm inclusive, preferably between 2 mm and 12 mm inclusive.

The current density in LED chips cannot be increased arbitrarily, which limits the luminance of LED chips and therefore also of semiconductor devices based on LED chips. However, the emitted luminance plays an important role in many applications in which the generated light is further processed in an optical system. Only if an étendue of a design is less than or equal to the étendue of the optical system can the emitted light be used in the application. Since a surface area of the emitter, in particular of the LED chip, enters linearly into the étendue calculation, the usable luminous flux is often limited by the luminance of the design and the étendue of the optical system.

With the semiconductor component described here, on the one hand, the luminance of the design can be increased to a value above that of the individual LED chips, and on the other hand, the étendue can be optimized to the target application, so that more light becomes usable for the application.

Instead of semiconductor chips or LED chips, other surface emitters can also be fitted with an appropriate optical body and reflector, such as organic light-emitting diodes or two-dimensional arrangements of other light sources, such as fluorescent tubes.

Alternative ways of generating high luminance levels involve optimizing the LED chips for high current densities and thus high luminance levels. In addition, fluorescent materials can be optically pumped, wherein the fluorescents are positioned remotely from the light source. A close-to-chip and far-from-chip conversion can be combined with one another. In addition, mirrored rods can be optically pumped with fluorescent material. An increase in luminance can also be achieved by means of spherical, mirrored collars on housing designs, or additional elements such as parabolic reflectors.

The semiconductor component described here does not require excessive current densities, so that the semiconductor layers of the semiconductor chips do not need to be specially adapted and the thermal loads can be kept comparatively low. In addition, a compact, space-saving design is provided by the close-to-chip mounting of the optical body and by forming the reflector directly around the optical body.

In the semiconductor component described here, in particular, a three-dimensional cavity with high reflectivity and optionally with suitable light redistribution properties at the design level is arranged downstream of a semiconductor chip, wherein the generated light preferably only emerges from the semiconductor component through the exit surface. One or more LED chips or other planar light sources, optionally already fitted with a fluorescent and/or an additional diffuser, are also arranged optically upstream of the cavity. The emitted light is injected through the larger input aperture, i.e. the base surface, and directed to the smaller output aperture, the exit surface. The LED chips themselves can function both as the light source and the reflector. Thus, a smaller étendue can be achieved than for the original luminous surface, in addition to a higher luminance, but at the expense of efficiency. The optical body is made of a solid or is alternatively a hollow body or cavity, defined by the cavity in the reflector.

The exit surface of the cavity and thus of the optical body can be adjusted with regard to transmission and emission characteristics by means of a coating or structuring. The cavity, and thus the optical body and/or the reflector, may have light-scattering properties that optimize the light flux through the exit surface.

The cavity formed by the optical body, with the at least one semiconductor chip as part of the reflector, enables an increase in luminance by suitable choice of their geometries. A further increase in luminance can be achieved by adjusting the geometry of the optical body, the reflection conditions at the reflector, in particular specular versus diffuse, by selecting the materials involved, by volume scattering properties and the like. A variation of the output aperture, i.e. the exit surface of the optical body, enables adaptation to the étendue of the corresponding application without variation of the semiconductor chips themselves. In the case of the semiconductor component, this additionally allows the placement of the fluorescent directly on the LED chips, ensuring good heat dissipation of the fluorescent, particularly in high-power applications.

According to at least one embodiment, one or more fluorescent bodies are located between the optical body and the semiconductor chip. The at least one fluorescent body is configured to convert the primary radiation into a longer-wavelength secondary radiation, either partially or completely. If more than one semiconductor chip is present, each semiconductor chip may be assigned a separate fluorescent body, or a single fluorescent body may extend across all semiconductor chips at once. A plurality of fluorescent bodies can also be assigned to one of the semiconductor chips.

According to at least one embodiment, the base surface completely covers the fluorescent body or bodies. This means that the whole surface of the at least one fluorescent body is covered by the optical body.

The at least one fluorescent is preferably selected from the following group: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiAl_3N_4]:Eu^{2+}$; garnets from the general system $(Gd,Lu,Tb,Y)_3(Al,Ga,D)_5(O,X)_{12}:RE$ with X=halogenide, N or bivalent element, D=trivalent or quadrivalent element and RE=rare earth metals such as $Lu_3(Al_{1-x}Ga_x)_5O_{12}:Ce^{3+}$, $Y_3(Al_{1-x}Ga_x)_5O_{12}:Ce^{3+}$; $Eu^{2+}$-doped sulfides such as (Ca,Sr, Ba)S:$Eu^{2+}$; $Eu^{2+}$-doped SiONs such as $(Ba,Sr,Ca)Si_2O_2N_2$:$Eu^{2+}$; SiAlONs, e.g. from the system $Li_xM_yLn_zSi_{12-(m+n)}Al_{(m+n)}O_nN_{16-n}$; beta-SiAlONs from the system $Si_{6-x}Al_zO_yN_{8-y}$:$RE_z$ with RE=rare earth metals; nitrido-orthosilicates such as $AE_{2-x-a}RE_xEu_aSiO_{4-x}N_x$ or $AE_{2-x-a}RE_x$-$Eu_aSi_{1-y}O_{4-x-2y}N_x$ with RE=rare earth metal and AE=earth-alkali metal or such as $(Ba,Sr,Ca,Mg)_2SiO_4$:$Eu^{2+}$; chlorosilicates such as $Ca_8Mg(SiO_4)_4Cl_2$:$Eu^{2+}$; chlorophosphates such as $(Sr,Ba,Ca,Mg)_{10}(PO_4)_6Cl_2$:$Eu^{2+}$; BAM-fluorescents from the BaO—MgO—$Al_2O_3$-system, such as $BaMgAl_{10}O_{17}$:$Eu^{2+}$; halophosphates such as $M_5(PO_4)_3(Cl,F)$:$(Eu^{2+},Sb^{2+},Mn^{2+})$; SCAP-fluorescents such as $(Sr,Ba,Ca)_5(PO_4)_3Cl$:$Eu^{2+}$. In addition, so-called quantum dots can also be introduced as converter material. Quantum dots in the form of nanocrystalline materials containing a group II-VI compound and/or group III-V compounds and/or a group IV-VI compound and/or metal-nanocrystals are preferred. In addition, the fluorescent material can have a quantum well structure and be epitaxially grown.

According to at least one embodiment, a distance between the fluorescent body and the at least one semiconductor chip and/or a distance between the fluorescent body and the optical body is no more than 50 µm or 20 µm or 10 µm or 5 µm. Thus, only a bonding means such as an adhesive is preferably present between the fluorescent body and the semiconductor chip and/or between the fluorescent body and the optical body. The bonding means is formed as a thin layer. Thin relates in particular to the height of the optical body. For example, these distances are preferably a maximum of 2% or 1% or 0.5% or 0.2% of the height of the optical body and contribute only a negligible amount to the overall thickness of the semiconductor component. Alternatively, it is possible that the fluorescent body is applied directly onto the semiconductor chip and/or that the optical body is applied directly to the fluorescent body, for example, by a printing process such as screen printing, or by fusion or molding, such as injection molding, directly onto the corresponding component.

According to at least one embodiment, a distance between the at least one semiconductor chip and the optical body is no more than 50 µm or 20 µm or 10 µm or 5 µm. The semiconductor chip can be mounted directly on the optical body. Alternatively, only a bonding agent such as an adhesive is present between the semiconductor chip and the optical body. In particular, this distance is a maximum of 2% or 1% or 0.5% or 0.2% of the height of the optical body and is therefore virtually negligible.

According to at least one embodiment, when viewed in cross-section and along a direction away from the semiconductor chip, the optical body has the shape of a symmetrical trapezium, in some regions or throughout. A mirror symmetry axis is preferably oriented perpendicular to the base surface and/or perpendicular to the main side of the semiconductor chip. This means that the optical body has side faces that are constantly inclined relative to the base surface, either in some regions or throughout. In particular, the optical body is designed as a regular pyramid frustum with a square or rectangular base surface.

According to at least one embodiment, when viewed in cross-section and in the direction away from the at least one semiconductor chip, the optical body has a shape consisting of one of the following three basic shapes: rectangle, symmetrical trapezium, rectangle. The trapezium can therefore be inserted between two rectangles. The side surfaces of the optical body thus extend along the semiconductor chip perpendicular to the base surface, then constantly inclined and then perpendicular again. The optical body preferably has a single mirror symmetry axis perpendicular to the base surface, viewed in cross-section.

According to at least one embodiment, viewed in cross-section and in the direction away from the at least one semiconductor chip the optical body is shaped as a stepped pyramid, preferably as a symmetrical stepped pyramid. The stepped pyramid can be regularly shaped and, in plan view, can have in particular two or four axes of symmetry, depending on whether the base surface is square or rectangular, which is preferably the case. For example, the stepped pyramid has two or three steps, but can also be formed by four or more steps. The individual steps of the stepped pyramid are preferably formed by rectangles, viewed in cross-section.

As an alternative to a symmetrical structure, the optical body can also be asymmetrically shaped in cross-section. In this case, it is possible that the optical body does not have an axis of symmetry when viewed in at least one or in all cross-sections.

According to at least one embodiment, in cross-section the optical body has a concave curvature in some regions or throughout. For example, a mirror symmetry axis is oriented perpendicular to the base surface. In this context, concave means in particular that the optical body is more sharply tapered close to the semiconductor chip than in regions further away from the semiconductor chip. Due to the concave curvature, the rate of tapering can decrease continuously and/or constantly in a direction away from the semiconductor chip. For example, a concave curved region is combined with a rectangular base, viewed in cross-section.

Alternatively, the optical body may be curved in cross-section in some areas or throughout, so that at least some regions of the optical body further away from the semiconductor chip are then more sharply tapered than in areas closer to the semiconductor chip.

According to at least one embodiment, the base surface is square or rectangular or regularly hexagonal. On the other hand, the radiating surface has a different basic geometric shape, viewed from above. In particular, the radiating surface is then rounded or circular or elliptical.

According to at least one embodiment, the base surface merges into the radiating surface in a direction away from the at least one semiconductor chip with a continuously differentiable side face. This means, for example, that viewed in cross-section perpendicular to the base surface, each side line of the side face can extend without bends.

Alternatively, the side face may have a bend and/or a step, or may have a plurality of bends and/or a plurality of steps. In this case, the side face cannot be continuously differentiated.

According to at least one embodiment, a quotient of the base surface area and the radiating surface area is at least 1 or 1.5 or 2. Alternatively or in addition, this ratio is no more than 8 or 5 or 3.5. In other words, the base surface is approximately twice or three times the size of the radiating surface. For example, with a quotient of 1 a preferably area-preserving transformation of the radiating surface is possible, for example from a rectangle to a square of equal size.

According to at least one embodiment, the size of the base surface is at least 1 $mm^2$ or 4 $mm^2$ or 6 $mm^2$ and/or at most 30 $mm^2$ or 50 $mm^2$ or 15 $mm^2$. Alternatively or in addition, the height of the optical body is at least 0.2 mm or 1 mm or 1.5 mm and/or not more than 7 mm or 5 mm or 3 mm. Accordingly, this results in the above values for the quotient of the base surface area and the height.

According to at least one embodiment, the reflector is partly or completely formed by a casting. The casting is preferably diffusely reflecting for visible light and the primary radiation. The casting can appear white to an observer. For example, the casting is made of a transparent and radiation-permeable matrix material, such as a silicone or an epoxy, which is filled with metal oxide particles made of titanium dioxide, for example.

According to at least one embodiment, the casting is planar and formed on a reflector upper side facing away from the at least one semiconductor chip. Alternatively or additionally, the reflector upper side can run parallel to the main side of the at least one semiconductor chip. This makes it possible for the semiconductor component to appear cuboidal in cross-section.

According to at least one embodiment, the casting forming the reflector has a minimum thickness of 0.1 mm or 0.2 mm or, preferably, 0.3 mm on the upper side of the reflector facing away from the at least one semiconductor chip, in particular directly on the optical body. This can be used to ensure that the reflector is impermeable to the primary radiation and/or visible light on the top of the reflector near the optical body also.

According to at least one embodiment, the reflector top terminates flush with the radiating surface. This means that the reflector top and the radiating surface can lie in a common plane and/or merge smoothly into one another.

According to at least one embodiment, the reflector is formed partly or completely by a specularly reflecting coating on the optical body. The coating can be applied directly to the side faces of the reflector. For example, the reflective coating covers at least 30% or 50% or 70% or 95% of the side faces of the optical body and/or not more than 90% or 60%.

In particular, it is possible that the reflector is composed of the reflective coating and the reflective casting and thus has specular and diffuse reflective sub-areas.

According to at least one embodiment, the reflective coating is a metal coating, or alternatively a dielectric coating in the form of a Bragg mirror, for example. The thickness of the coating is preferably no more than 10 µm or 2 µm or 0.5 µm. Alternatively, or in addition, this thickness is no more than 1% of the height of the optical body. The coating is thus thin compared to the optical body.

According to at least one embodiment, the radiating surface is structured, preferably having a geometric structuring such as a roughening. The structuring is preferably regular and formed, for example, by dome-shaped elevations. Alternatively or in addition to structuring, a coating such as a color filter layer and/or an anti-reflective layer may be present. The structuring and/or the coating on the radiating surface can be used to improve the light extraction efficiency and/or to adjust spectral radiation properties, in particular.

According to at least one embodiment, one or more cavities are formed at points between the reflector and the optical body. It is possible that the at least one cavity is designed for total reflection of the primary radiation and/or the secondary radiation. Preferably, the cavity is located directly on the side faces of the optical body. The side faces are preferably covered by the cavity or cavities up to a maximum of 50% or 30% or 10% and/or to at least 2% or 5% or 25%.

According to at least one embodiment, the at least one semiconductor chip is mounted on a heat sink. The heat sink can be a metal body made of copper, for example. The heat sink can also be implemented as a ceramic carrier or as a circuit board, in particular as a metal core board, or MCB for short.

According to at least one embodiment, the reflector and/or the optical body terminate flush with the heat sink in a lateral direction, in particular in a direction parallel to the base surface.

In accordance with at least one embodiment the semiconductor component comprises one or more of the semiconductor chips. The semiconductor chips are preferably arranged in a regular pattern. Preferably, at least four or six and/or a maximum of 32 or 16 of the semiconductor chips are present, which are preferably arranged in a square grid.

According to at least one embodiment, the semiconductor chips are contiguously covered by the base surface without interruption. The optical body is preferably free of a beam guidance device for individual or groups of semiconductor chips. In other words, after entering the optical body any difference between the primary radiation coming from the different semiconductor chips is blurred. In other words, a single, common and internally unstructured optical body is present for all semiconductor chips together.

According to at least one embodiment, spaces are formed between adjacent semiconductor chips. For example, the spaces have a width of at least 1 µm and/or a maximum of 150 µm or 50 µm or 10 µm. The spaces can be partially or completely filled with a casting body. The casting body is preferably designed to be reflective, at least for the primary radiation, preferably also for the secondary radiation and/or visible light.

In the following an optoelectronic semiconductor component described herein is explained in more detail with reference to the drawing and on the basis of exemplary embodiments. Identical reference signs indicate the same elements in the individual figures. The represented elements are not shown true to scale, however; rather, individual elements can be represented in exaggerated size for improved comprehension.

Figure 8:
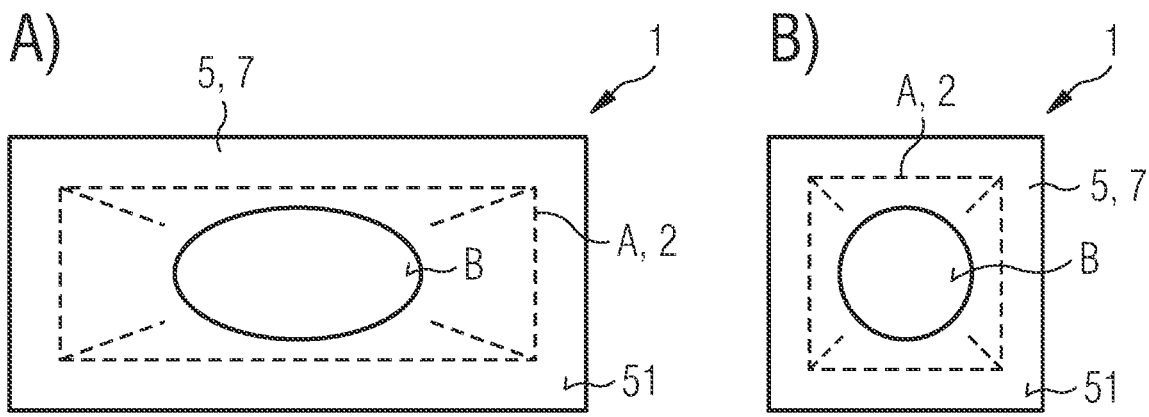
Figure 9:
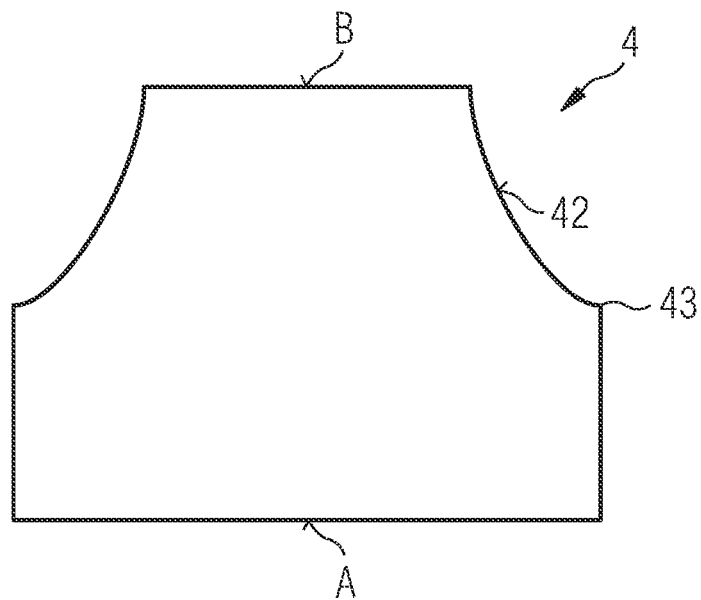
Figure 10:
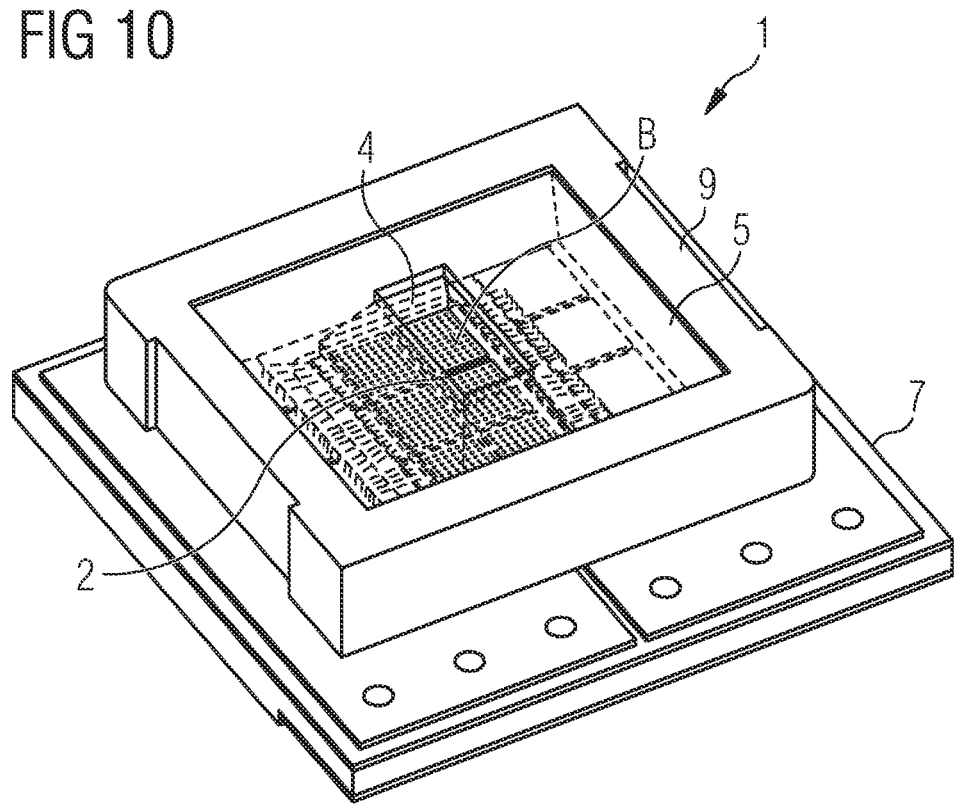

In the drawings:

FIG. 1A shows a schematic sectional view of an exemplary embodiment of an optoelectronic semiconductor component described here, FIG. 1B shows a schematic perspective drawing of the semiconductor component of FIG. 1A, FIG. 2A shows a schematic sectional view of an exemplary embodiment of an optoelectronic semiconductor component described here, FIG. 2B shows a schematic perspective drawing of the semiconductor component of FIG. 2A, FIGS. 3 to 7 show schematic sectional drawings of exemplary embodiments of optoelectronic semiconductor components described here, FIGS. 8A and 8B show schematic plan views of exemplary embodiments of optoelectronic semiconductor components described here, FIG. 9 shows a schematic sectional view of an optical body for exemplary embodiments of optoelectronic semiconductor components described here, and FIG. 10 shows a schematic perspective drawing of an exemplary embodiment of an optoelectronic semiconductor component described here.

FIG. 1 shows an exemplary embodiment of an optoelectronic semiconductor component 1. On a heat sink 7, made of copper for example, six semiconductor chips 2 are mounted in a 2×3 arrangement. Light-emitting main sides 20 of the semiconductor chips 2 face away from the heat sink 7. The heat sink preferably comprises conductor tracks and connection points for electrically contacting the semiconductor chips 2. Accordingly, electrical insulation layers may be present, not shown.

Each of the semiconductor chips 2 is assigned a fluorescent body 3. The fluorescent bodies 3 are, for example, small ceramic panels consisting of sintered fluorescent material or in which a fluorescent material is embedded in a ceramic matrix. For example, the fluorescent bodies 3 produce green light from the blue light from the semiconductor chips 2, thus operating a full conversion, or a portion of the blue light from the semiconductor chip 2 is converted into yellow light, resulting in a white mixed light overall.

Arranged jointly downstream of the semiconductor chips 2 and the fluorescent bodies 3 is an optical body 4, made of glass or a silicone, for example. This means the optical body 4 is made of a transparent, clear material for visible light.

Between the semiconductor chips 2 and the fluorescent bodies 3 and/or between the fluorescent bodies 3 and the optical body 4 a bonding means 47 may be present, for example, a thin layer of a bonding compound such as a silicone adhesive. The bonding compound 47 preferably reduces or eliminates abrupt refractive index changes between the semiconductor chips 2, the fluorescent bodies 3 and the optical body 4.

The optical body 4 tapers in a direction away from the semiconductor chips 2. For this purpose, the optical body 4 is composed of three regions. A rectangular region, viewed in cross-section, is located directly on the fluorescent bodies 3 and on the associated bonding compound 47, which is followed by a trapezoidal region. A rectangular region is in turn located directly on an exit surface B of the optical body 4, which is facing away from the semiconductor chips 2. A thickness of the two rectangular regions on the exit surface B or on a base surface A of the optical body 4 facing the fluorescent bodies 3 is preferably at least 0.1 mm and/or no more than 0.5 mm. An overall height H of the optical body 4 is preferably at least 1 mm and/or no more than 3 mm.

Alternatively, as is also possible in all other exemplary embodiments, the optical body 4 is not formed by a solid body, but either solely or predominantly by the cavity in the reflector 5 itself. This means that the optical body 4 can also consist of air.

For example, the semiconductor chips 2 have a base surface area of 2 $mm^2$ each, so that a total size of the base surface A is approximately 12 $mm^2$.

The semiconductor component 1 further comprises a reflector 5 with a reflector upper side 51 on the opposite side to the heat sink 7. The reflector upper side 51 merges with the exit surface B in a planar manner. Due to the reflector 5, the semiconductor component 1 appears rectangular in cross-section and is overall cuboidal in shape.

The transparent optical body 4 forms a cavity inside the reflector 5. The reflector 5 is preferably formed by a casting, for example by a silicone filled with titanium dioxide particles, so that the reflector reflects diffusely and appears white. Due to the rectangular cross-section of the optical body 4 on the exit surface B, the reflector 5 is also lightproof over the entire reflector upper side 41 so that the light generated only emerges from the semiconductor component 1 at the exit surface B.

Figure 2:
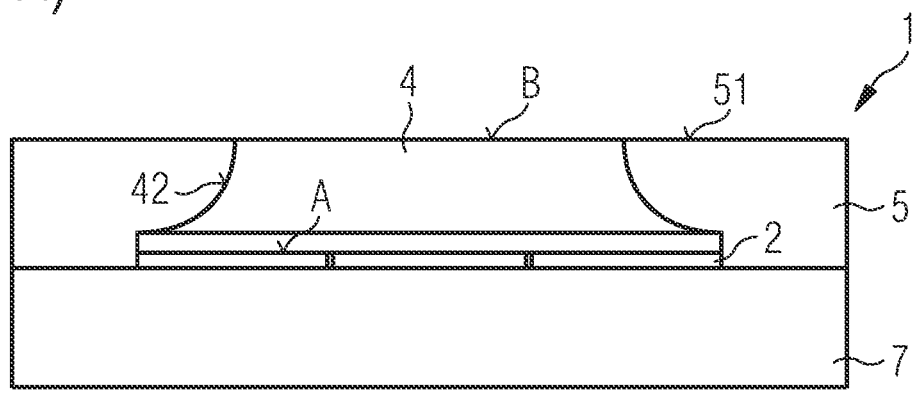
Figure 2:
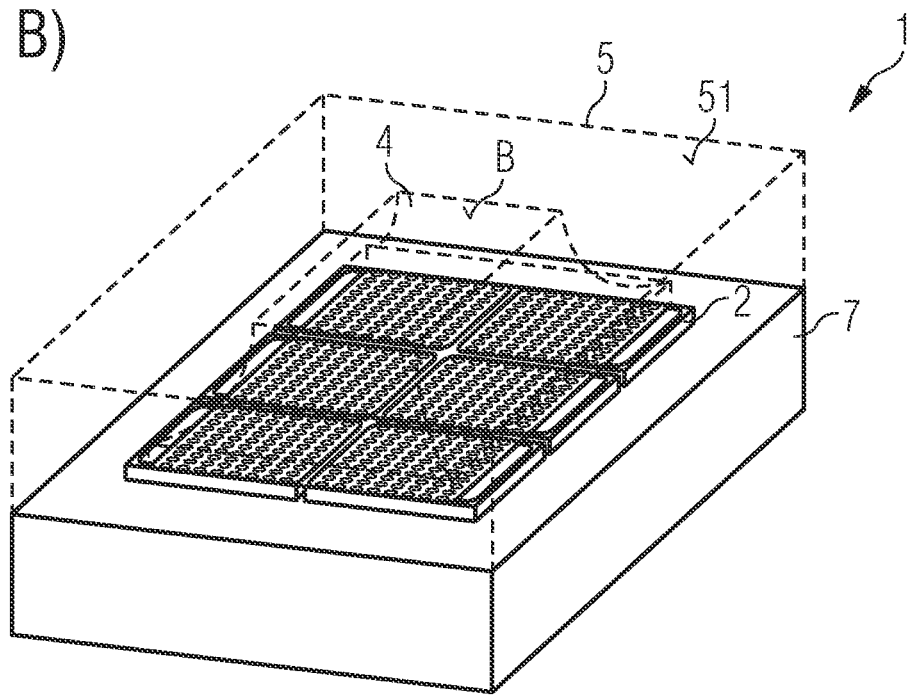

In the exemplary embodiment of FIG. 2, side faces 42 of the optical body 4 have a concave curvature toward the exit surface B. On the base surface A a cuboidal, rectangular in cross-section, region of the optical body 4 is optionally present, again with a thickness of preferably at least 0.1 mm and/or no more than 0.5 mm. The optical body 4 is located directly on the semiconductor chips 2, without the presence of fluorescent bodies. Optionally, a thin layer of a bonding compound, not illustrated in FIG. 2, may be located between the semiconductor chips 2 and the optical body 4.

Figure 3:
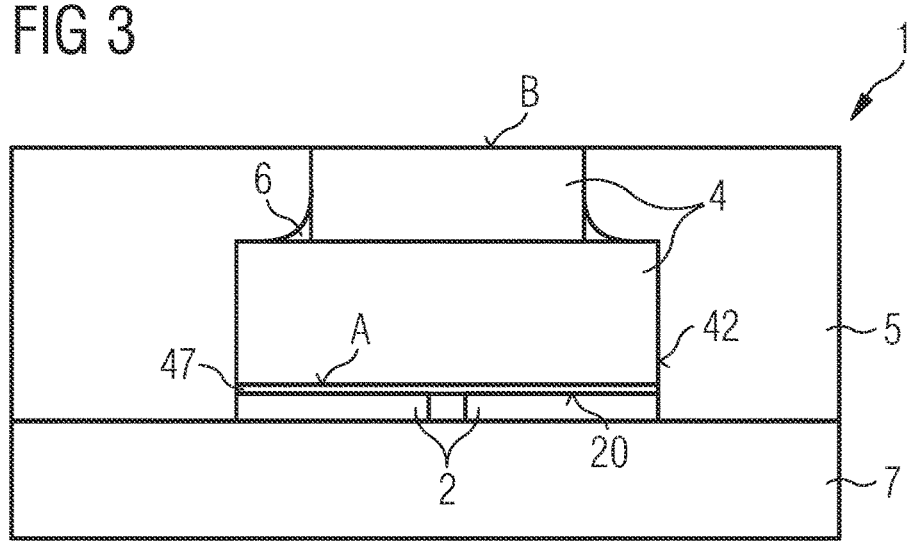

In the exemplary embodiment of FIG. 3, it is illustrated that the optical body 4 is formed by a stepped pyramid. This means that the side faces 42 extend either perpendicular or parallel to the base surface A and to the main sides 20 of the semiconductor chips 2, which are preferably LED chips.

It is possible for cavities 6 to form in valleys, in particular at step transitions. These cavities 6 can lead to an increased reflection of the radiation due to total internal reflection. Alternatively, the side faces 42 of the optical body 4 are directly and completely covered over their whole surface by the reflector 5, formed as a casting.

Figure 4:
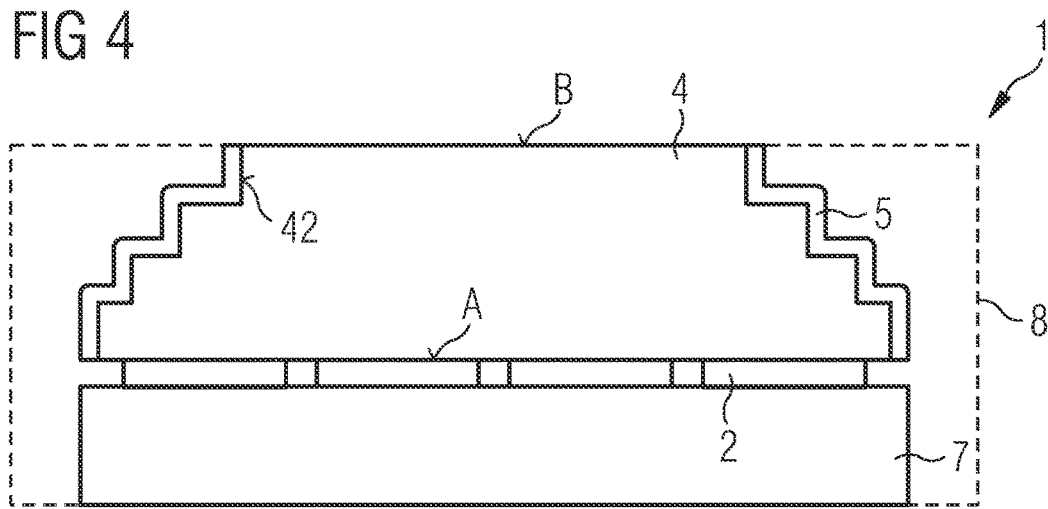

The stepped pyramid, which implements the optical body 4, has only two steps in FIG. 3. FIG. 4 illustrates the fact that there may also be more steps present, in this case four steps. FIG. 4 also shows that the reflector 5 is formed by a coating which can completely cover the side faces 42. The base surface A and the exit surface B are free of this coating. The coating is, for example, a specularly reflecting metallic layer or else a dielectric layer stack, for example a Bragg mirror.

Optionally, a casting body 8 is present, in which the optical body 4, the reflector 5 and optionally the heat sink 7 can be embedded. The casting body 8 can be designed to be reflecting and in particular white, or else transparent or absorbent, for example black, depending on the particular requirements on the semiconductor component 1.

Such a coating for the reflector 5, as shown in FIG. 4, can also be present in the exemplary embodiments, in particular those of FIGS. 1 to 3, in addition to the casting. This allows the reflective effect to be produced not by the casting, but by the coating. This results in less luminous power and therefore also less heat being introduced into the casting of FIGS. 1 to 3.

Figure 5:
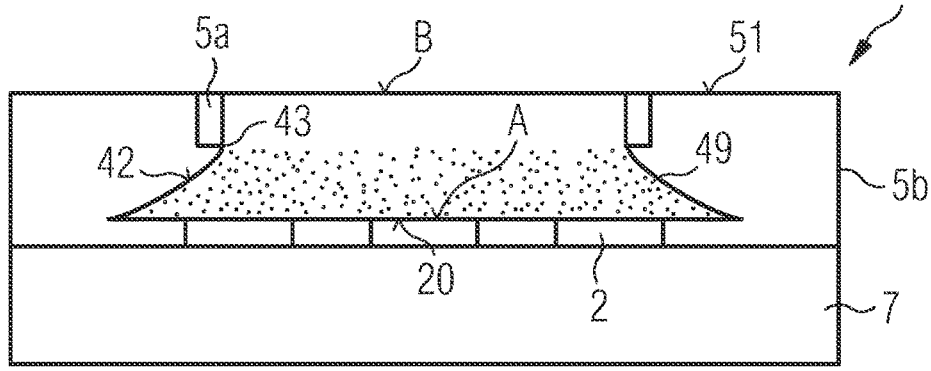

FIG. 5 shows that the side faces 42 are formed partly by the reflector 5a in the form of a specularly reflecting coating and partly by the reflector 5b in the form of a diffusely reflective casting. The side faces 42 each optionally have a bend 43. Below the bend 43, closer to the semiconductor chips 2, the side faces 42 have a continuous concave curve, above the bend 43 the side faces 42 are oriented perpendicular to the base surface A and run in a straight line. A corresponding combination of a coating and a casting on the side faces 42 is also possible in all other exemplary embodiments.

Optionally, the optical body 4 can significantly overhang the semiconductor chips 2 in a lateral direction, unlike in the exemplary embodiments of FIGS. 1 and 4. FIG. 5 also illustrates the option in which a scattering means 49 is introduced into the optical body 4. The scattering means 49 is formed by light-scattering particles, for example. It is possible that the scattering means 49 is concentrated in the optical body 4 in a sedimented manner close to the semiconductor chips 2. As an alternative to the illustration of FIG. 5, the scattering means 49 can also be distributed uniformly in the optical body 4. Appropriate configurations can also be applied in a similar manner in all other exemplary embodiments.

Figure 6:
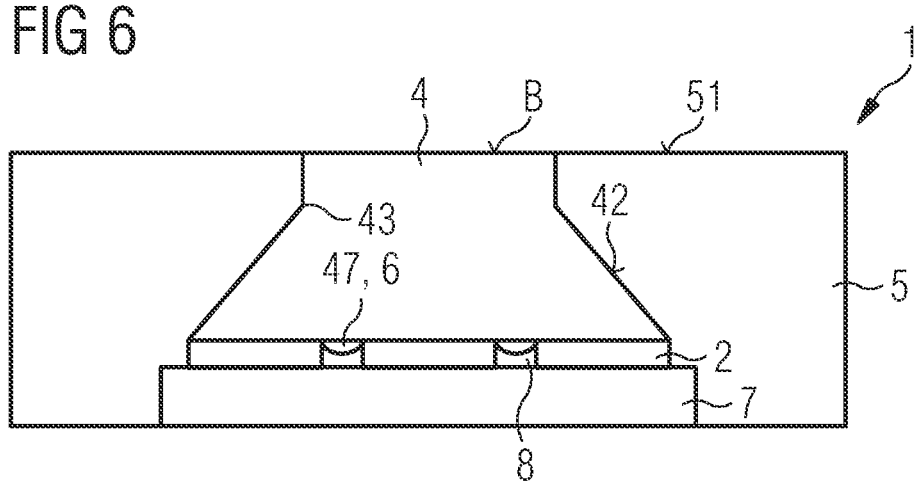

FIG. 6 shows that in cross-section, the side faces 42 are each formed by two straight sections, separated by the bend 43. The section closer to the semiconductor chips 2 is designed in the shape of a pyramid frustum, the section further away from the semiconductor chips 2 as a rectangular block.

Optionally, gaps are present between the semiconductor chips 2. These gaps are preferably filled by the casting body 8 either partially or, unlike in the drawing of FIG. 6, completely. The casting body 8 is preferably a white, diffusely reflecting material such as a silicone filled with titanium dioxide particles. A cavity 6 can be formed on one side of the casting body 8 facing away from the heat sink 7, or else excess bonding means 47 can collect in this region towards the optical body 4.

In plan view, the casting body 8 is preferably designed as a square line pattern or rectangular line pattern. Due to the casting body 8, the reflectivity in the gaps between the semiconductor chips 2 is not limited by the reflectivity of the heat sink 7.

It is possible that an underside of the semiconductor component 1 is formed by the reflector 5 together with the heat sink 7.

Figure 7:
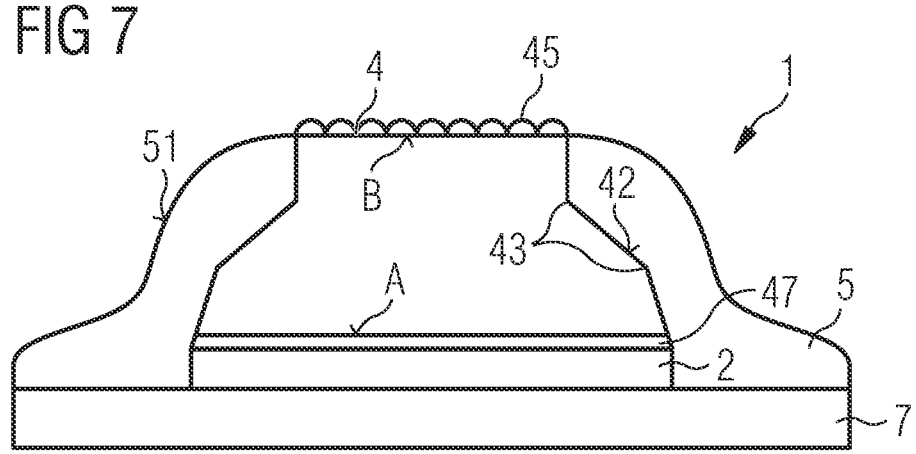

FIG. 7 illustrates the fact that the exit surface B is provided with a structuring 45. The structuring 45 is preferably formed by regularly arranged domes. The structuring 45 can be used to increase the light extraction efficiency. Alternatively or in addition to such a structuring 45, an optically effective coating such as an anti-reflective coating may also be provided. The same applies to all other exemplary embodiments.

The optical body 4 is formed by two pyramid frustums and a rectangular block. The pyramid frustum which is closer to the single semiconductor chip 2, for example, has steeper side faces 42 than the central pyramid frustum.

The reflector 5 is designed as a casting, but the casting follows the shape of the outline of the optical body 4. As a result, the semiconductor component 1 is not necessarily rectangular in cross-section.

FIG. 8A shows that the base surface A and the arrangement of the semiconductor chips 2 are rectangular. On the other hand, the exit surface B is rounded, preferably in the shape of an ellipse. A transition from the larger, angled base surface A to the rounded, smaller exit surface B preferably proceeds continuously and without jumps or edges.

FIG. 8B shows that the base surface A is square and the associated exit surface B is in the shape of a circle.

The shapes for the optical body 4 that are shown in the various exemplary embodiments can each be combined with a reflector 5 in the form of a coating and/or a casting. Similarly, the different configurations for the bonding means 47 and the heat sink 7, as well as for the optional casting body 8 and the scattering means 49, can be combined.

The optical body 4 of FIG. 9 has a concave shape in cross-section at the exit surface B. This region with the concave shape is mounted directly on the base surface A on a rectangular base.

The rectangular block and the concave region are joined to each other at a bend 43. Such a base can also be present in the other exemplary embodiments, in particular in FIGS. 5 to 8.

In the exemplary embodiment of FIG. 10, it is shown that the reflector 5 is located in a frame 9. For example, the frame 9 is made from a paste, also known as glob top, or from a plastic such as an injection-molded part, or from a semiconductor frame such as silicon, or a metal frame. The reflector 5 can terminate flush with the frame 9 towards the exit surface B.

It is possible that the heat sink 7, which preferably is or comprises a printed circuit board, overhangs the frame 9 on all sides. The frame 9 allows the optical body 4 to be placed in the frame 9 first and then the reflector to be formed by casting the remaining space in the frame. Such a frame 9, which can also be round rather than rectangular in plan view, can also be present in all other exemplary embodiments.

The components shown in the figures, unless otherwise indicated, preferably follow one another directly in the specified sequence. Layers that do not touch each other in the figures are preferably spaced apart from each other. Where lines are drawn parallel to each other, the corresponding surfaces are preferably also oriented parallel to each other. Also, unless otherwise indicated, the relative positions of the drawn components with respect to one another are reproduced correctly in the figures.

The invention described here is not limited by the description based on the exemplary embodiments. Rather, the invention comprises each new feature, as well as any combination of features, which includes in particular every combination of features in the patent claims, even if this feature or this combination itself is not explicitly specified in the patent claims or exemplary embodiments.

LIST OF REFERENCE SIGNS 1 optoelectronic semiconductor component
2 semiconductor chip
20 main side
3 fluorescent body
4 optical body
42 side face of the optical body
43 bend in the side face of the optical body
45 structuring
47 bonding means
49 scattering means
5 reflector
51 reflector upper side
6 cavity
7 heat sink
8 casting body
9 frame
A base surface of the optical body
B exit surface of the optical body
H height of the optical body

The invention claimed is:

1. An optoelectronic semiconductor component, comprising:
at least one semiconductor chip for generating a primary radiation,
a non-imaging optical body which is located optically downstream of the at least one semiconductor chip, wherein the optical body consists of a transparent, clear material for visible light, and
a reflector, which laterally encloses the optical body on all sides in a positive-locking manner and is configured for reflecting at least the primary radiation and the visible light,
wherein
the optical body has a base surface facing the at least one semiconductor chip and an exit surface facing away from the at least one semiconductor chip,
the optical body tapers in a direction away from the at least one semiconductor chip,
a quotient of an area of the base surface and a height of the optical body is between 1 mm and 30 mm inclusive,
at least one fluorescent body is located between the at least one semiconductor chip and the optical body and is configured for converting the primary radiation partially or completely into a longer-wavelength secondary radiation,
the base surface completely covers the fluorescent body, and spaces between adjacent semiconductor chips are partially or completely filled with a casting body configured to reflect at least the primary radiation.

2. The optoelectronic semiconductor component as claimed in claim 1,
in which a distance between the fluorescent body and the at least one semiconductor chip and a distance between the fluorescent body and the optical body is in each case no more than 50 µm, and/or these distances are no more than 1% of the height of the optical body.

3. The optoelectronic semiconductor component as claimed in claim 1,
in which a distance between the at least one semiconductor chip and the optical body is no more than 50 µm and the optical body directly optically follows the at least one semiconductor chip,
this distance being no more than 1% of the height of the optical body.

4. The optoelectronic semiconductor component as claimed in claim 1,
in which the optical body, viewed in cross-section along a direction away from the at least one semiconductor chip, is shaped in some regions or throughout as a symmetrical trapezium.

5. The optoelectronic semiconductor component as claimed in claim 1,
in which the optical body, viewed in cross-section in a direction away from the at least one semiconductor chip, has a shape of a rectangle or a symmetrical trapezium.

6. The optoelectronic semiconductor component as claimed in claim 1,
in which the optical body, viewed in cross-section along a direction away from the at least one semiconductor chip, is shaped in some regions or throughout as a symmetrical stepped pyramid.

7. The optoelectronic semiconductor component as claimed in claim 1,
in which the optical body, viewed in cross-section, is symmetrically concavely curved.

8. The optoelectronic semiconductor component as claimed in claim 1,
in which the base surface is square or rectangular, whereas the exit surface is circular or elliptical in plan view,
wherein the base surface merges into the exit surface in a direction away from the at least one semiconductor chip with a continuously differentiable side face.

9. The optoelectronic semiconductor component as claimed in claim 1,
in which a quotient of the area of the base surface and an area of the exit surface is between 1.5 and 5 inclusive,
wherein area of the base surface is between 1 mm² and 30 mm² inclusive and the height is between 1 mm and 5 mm inclusive.

10. The optoelectronic semiconductor component as claimed in claim 1,
in which the reflector is formed by a casting, which diffusely reflects and appears white to an observer,
wherein the casting has a planar form on a reflector upper side facing away from the at least one semiconductor chip and runs parallel to a main side of the at least one semiconductor chip.

11. The optoelectronic semiconductor component as claimed in claim 10,
in which the casting has a minimum thickness of 0.2 mm on the reflector upper side facing away from the at least one semiconductor chip, and
the reflector upper side terminates flush with the exit surface.

12. The optoelectronic semiconductor component as claimed in claim 1,
in which the reflector is formed in some places or entirely by a specularly reflective coating on the optical body,
wherein the coating is a metal coating of a thickness not exceeding 10 µm.

13. The optoelectronic semiconductor component as claimed in claim 1,
in which the exit surface is provided with a regular geometric structuring to improve light extraction efficiency.

14. The optoelectronic semiconductor component as claimed in claim 1,
in which at least one cavity is formed at some places between the reflector and the optical body.

15. The optoelectronic semiconductor component as claimed in claim 1,
in which the at least one semiconductor chip is mounted on a heat sink and the reflector terminates flush with the heat sink,
wherein the semiconductor component is rectangular when viewed in cross-section.

16. The optoelectronic semiconductor component as claimed in claim 1,
in which the base surface is a contiguous, uninterrupted base surface, and a plurality of the semiconductor chips are mounted in a regular pattern on the contiguous, uninterrupted base surface, the optical body being free of a beam guidance device for individual or groups of semiconductor chips.

17. An optoelectronic semiconductor component, comprising:
at least one semiconductor chip for generating a primary radiation,
a non-imaging optical body which is located optically downstream of the at least one semiconductor chip, wherein the optical body consists of a transparent, clear material for visible light, and
a reflector, which laterally encloses the optical body on all sides in a positive-locking manner and is configured for reflecting at least the primary radiation and the visible light,
wherein
the optical body has a base surface facing the at least one semiconductor chip and an exit surface facing away from the at least one semiconductor chip,
the optical body tapers in a direction away from the at least one semiconductor chip,
a quotient of an area of the base surface and a height of the optical body is between 1 mm and 30 mm inclusive,
at least one fluorescent body is located between the at least one semiconductor chip and the optical body and is configured for converting the primary radiation partially or completely into a longer-wavelength secondary radiation,
the base surface completely covers the fluorescent body, and
the reflector is formed by a casting, which diffusely reflects and appears white to an observer, and
the casting has a planar form on a reflector upper side facing away from the at least one semiconductor chip and runs parallel to a main side of the at least one semiconductor chip.

18. An optoelectronic semiconductor component, comprising:
- at least one semiconductor chip for generating a primary radiation,
- a non-imaging optical body which is located optically downstream of the at least one semiconductor chip, wherein the optical body consists of a transparent, clear material for visible light, and
- a reflector, which laterally encloses the optical body on all sides in a positive-locking manner and is configured for reflecting at least the primary radiation and the visible light, wherein the optical body has a base surface facing the at least one semiconductor chip and an exit surface facing away from the at least one semiconductor chip, the optical body tapers in a direction away from the at least one semiconductor chip, a quotient of an area of the base surface and a height of the optical body is between 1 mm and 30 mm inclusive, at least one fluorescent body is located between the at least one semiconductor chip and the optical body and is configured for converting the primary radiation partially or completely into a longer-wavelength secondary radiation, the base surface completely covers the fluorescent body, and at least one cavity is formed at some places between the reflector and the optical body.

* * * * *